(12) United States Patent
Ikeda et al.

(10) Patent No.: US 8,628,896 B2
(45) Date of Patent: Jan. 14, 2014

(54) MEMBER FOR MASKING FILM, PROCESS FOR PRODUCING MASKING FILM USING THE SAME, AND PROCESS FOR PRODUCING PHOTOSENSITIVE RESIN PRINTING PLATE

(75) Inventors: Takeshi Ikeda, Minamisaitama-gun (JP); Toshihiro Tsutsui, Nerima-ku (JP); Masafumi Mitsuhashi, Atsugi (JP)

(73) Assignee: LINTEC Corporation, Tokyo (JP)

( * ) Notice: Subject to any disclaimer, the term of this patent is extended or adjusted under 35 U.S.C. 154(b) by 166 days.

(21) Appl. No.: 13/258,573

(22) PCT Filed: Mar. 25, 2010

(86) PCT No.: PCT/JP2010/055996
§ 371 (c)(1),
(2), (4) Date: Sep. 22, 2011

(87) PCT Pub. No.: WO2010/114085
PCT Pub. Date: Oct. 7, 2010

(65) Prior Publication Data
US 2012/0015288 A1  Jan. 19, 2012

(30) Foreign Application Priority Data
Mar. 31, 2009  (JP) .................................. 2009-86739

(51) Int. Cl.
G03F 7/09 (2006.01)
G03F 7/26 (2006.01)

(52) U.S. Cl.
USPC ......... 430/5; 430/271.1; 430/273.1; 430/306; 430/944

(58) Field of Classification Search
USPC ............... 430/5, 271.1, 273.1, 306, 300, 944
See application file for complete search history.

(56) References Cited

U.S. PATENT DOCUMENTS

| 4,132,168 | A | 1/1979 | Peterson | |
|---|---|---|---|---|
| 6,576,374 | B1 * | 6/2003 | Kim | 430/5 |
| 7,625,676 | B2 * | 12/2009 | Yoshikawa et al. | 430/5 |
| 2002/0115019 | A1 | 8/2002 | Kaczun et al. | |
| 2003/0143471 | A1 | 7/2003 | Mitsuhashi et al. | |
| 2004/0048198 | A1 | 3/2004 | Telser et al. | |
| 2005/0115920 | A1 | 6/2005 | Hiller et al. | |
| 2005/0271950 | A1 | 12/2005 | Nishikawa et al. | |
| 2006/0057469 | A1 * | 3/2006 | Kureishi et al. | 430/5 |

FOREIGN PATENT DOCUMENTS

| CN | 1159073 A | 9/1997 |
|---|---|---|
| CN | 1164673 A | 11/1997 |
| EP | 1213615 A2 | 6/2002 |
| FR | 2258649 A1 | 8/1975 |
| JP | 05-024172 A | 2/1993 |
| JP | 10-067088 A | 3/1998 |
| JP | 2003-035955 A | 2/2003 |
| JP | 2003-215777 A | 7/2003 |
| JP | 2005-221842 A | 8/2005 |
| JP | 2007-114255 A | 5/2007 |
| WO | 93/23253 A1 | 11/1993 |
| WO | WO 93/23253 A1 | 11/1993 |
| WO | 02/054154 A2 | 7/2002 |
| WO | WO 02/054154 A2 | 7/2002 |
| WO | 2004/091927 A1 | 10/2004 |
| WO | WO 2004/091927 A1 | 10/2004 |

OTHER PUBLICATIONS

English-language International Search Report for PCT/JP2010/055996.
Chinese Office Action dated May 2, 2013, which issued in the counterpart Chinese Patent Application No. 2013042600297250, and an English-language translation of the Search Report thereof.
Chinese Office Action dated May 2, 2013, which issued in the counterpart Chinese Patent Application No. 201080015261.0 and an English-language translation of the Search Report thereof.
Supplementary European Search Report mailed Apr. 23, 2013 for EP 10758856.

* cited by examiner

*Primary Examiner* — Anca Eoff
(74) *Attorney, Agent, or Firm* — Holtz Holtz Goodman & Chick, PC (57) ABSTRACT

A member for masking films including a base film transparent to ultraviolet rays, an ultraviolet-shielding resin layer capable of being removed by irradiation with a laser light beam and having an average thickness of 0.1 to 30 μm, and a protective layer having a thickness of 0.05 to 1.5 μm and comprising, as a resin component, a polyester-base resin having a glass-transition temperature of not less than 40° C. laminated to a surface of the outermost layer of the ultraviolet-shielding resin layer, wherein the ultraviolet-shielding resin layer is a multilayer structure composed of two or more layers including a resin layer (A) having a high carbon black content and a resin layer (B) having a low carbon black content, the layer (A) and the layer (B) being located on the base-film side and on the printing-plate side of the ultraviolet-shielding resin layer, respectively.

8 Claims, 1 Drawing Sheet

MEMBER FOR MASKING FILM, PROCESS FOR PRODUCING MASKING FILM USING THE SAME, AND PROCESS FOR PRODUCING PHOTOSENSITIVE RESIN PRINTING PLATE

CROSS-REFERENCE TO RELATED APPLICATION

This application is a U.S. national phase application of International Application PCT/JP2010/055996 filed Mar. 25, 2010.

TECHNICAL FIELD

The present invention relates to a member for masking films, a process for producing a masking film using the same, and a process for producing a photosensitive resin printing plate. More specifically, the present invention relates to a member for masking films, which is a member suitable for the production of a masking film to be used in the production of photosensitive resin printing plates such as flexographic printing plates and letterpress printing plates and the like, and wherein areas at which an ultraviolet-shielding resin layer is removed with a laser beam exhibit uniform light transmittance, and the ultraviolet-shielding resin layer is resistant to scratches. Further, the member for masking films provides a masking film which, in the production of a large-sized printing plate, allows easy positioning and less likely to trap air when brought into close contact with the plate, so that the entire surface easily comes into close contact with a printing material. The present invention also relates to a process for producing a masking film using the same and a process for producing a photosensitive printing plate using the masking film.

BACKGROUND ART

In the past, photosensitive resin printing plates have been known, such as flexographic printing plates obtained, using a printing material including a photosensitive resin layer, by exposing the photosensitive resin layer through a masking film as a negative film having a desired pattern, and then removing unexposed portions of the photosensitive resin layer by washing.

Masking films used in the production of such a photosensitive resin printing plate are generally produced by photographic methods using silver salts or various printing methods such as a laser beam printer. However, these methods cannot deal with large-sized masking films. In the case where large-sized masking films for use in the printing of newspapers or the like, for example, are required, two or more masking films are used, and they are joined together in an aligned manner. In addition, in a photographic method, although resolution is excellent, there are drawbacks in that the operation must be done in a special dark room, and, further, a number of chemical treatments are required, whereby the operation is complicated, for example. Meanwhile, in a printing method, the pattern can be formed directly by a printer using digital data, so the operation is simple. However, in a printing method that uses a laser beam printer offered by XANTE (U.S.), there are drawbacks in that chemical treatments are required in order to increase the light-blacktop properties of a masking film, and also that the resolution is poor.

Meanwhile, in the field of printing plate production, as a technique that uses a laser beam, for example, the following disclosures have been made: a resin printing plate having a depressed portion for printing, which is formed, using a printing material having a resin layer on the surface thereof, by irradiating a desired portion of the resin layer with a laser beam to allow the resin layer to sublimate or decompose (see, e.g., Patent Document 1); a printing plate formed, using a resin printing material having on a substrate an ionizing-radiation-sensitive resin layer and an ionizing-radiation-shielding layer, by first removing the ionizing-radiation-shielding layer corresponding to printing image with a laser beam, then subjecting the ionizing-radiation-sensitive resin layer corresponding to such areas to ionizing radiation, and subsequently developing the ionizing-radiation-sensitive resin layer (see, e.g., Patent. Document 2); etc.

However, these techniques are techniques of producing a printing plate by irradiating a resin printing material directly with a laser beam rough no masking film, and are not techniques of producing a masking film.

Under such circumstances, the present inventors have previously proposed a member for masking films suitable for the production of a masking film to be used in the production of a photosensitive resin printing plate such as a flexographic printing plate or the like, which provides a masking film that does not require a chemical treatment, allows high resolution to be achieved by etching with a laser beam, and is applicable to large-sized plates, as well as a process for producing a masking film using the same (see e.g., Patent Document 3).

Further, as an improvement of such a technique, they have proposed a member for masking films, including a base film transparent to ultraviolet rays and, on one surface thereof, a 0.1- to 30-μm-thick ultraviolet-shielding resin layer whose color can be eliminated by irradiation with a laser light beam and which has an ultraviolet transmittance of not less than 0.1% before irradiation with a laser light beam. The ultraviolet-shielding resin layer contains, as a blackish pigment, a carbon black having an average particle size of 20 to 50 nm, a specific surface area of 70 to 150 $m^2/g$, and a center-line-average surface roughness Ra of 0.1 to 3 μm (see, e.g., Patent Document 4).

A masking film obtained using this member for masking films has favorable characteristics as above. However, because the ultraviolet-shielding resin layer is a single layer, the masking film is prone to defects, such as coating nonuniformity and pinholes, as well as scratches due to abrasion the resin layer surface, etc. Thus, in areas whose color has been eliminated by a laser beam, such problems may directly appear as a irregularity in light transmittance, or pinhole areas may be exposed, which may make it impossible to accurately produce a printing plate. Therefore, it has always been sufficiently satisfactory.

Further, in order to efficiently perform accurate processing with a laser, there has been a demand for a member for masking films, which has an ultraviolet-shielding resin layer with reduced thickness or has fewer defects in the production process, such as coating nonuniformity and pinholes.

PRIOR ART DOCUMENTS

Patent Documents

[Patent Document 1] Japanese Patent Application Laid Open Publication No. H05-24172

[Patent Document 2] Japanese Patent Application Laid-Open Publication No. H10-67088

[Patent Document 3] Japanese Unexamined Patent Application Publication No. 2003-215777

[Patent Document 4] Japanese. Unexamined Patent Application Publication No. 2005-221842

SUMMARY OF THE INVENTION

Problems to be Solved by the Invention

The present invention was accomplished under such circumstances. An object of the prevent invention is to provide a member for masking films, which is a member that is excellent in terms of the production stability of an ultraviolet-shielding resin layer while maintaining abrasion resistance and adhesion with a base film, and is suitable for the production of a masking film to be used in the production of a photosensitive resin printing plate or the like, and wherein the accurate and precise removal of the ultraviolet-shielding resin layer using a low-energy laser beam gives areas with uniform light transmittance, and the ultraviolet-shielding resin layer is resistant to scratches. Further, the member for masking films provides a masking film which, in the production of a large-sized printing plate, allows easy positioning and is less likely to trap air when brought into close contact with the printing plate, so that the entire surface easily comes into close contact with a printing material. The present invention is also aimed at providing a process for producing a masking film using the same and a process for producing a photosensitive resin printing plate using the masking film.

Means of Solving the Problems

The present inventors conducted extensive research to achieve the above objects. As a result, they found that a member that includes, on one surface of a base film transparent to ultraviolet rays, an ultraviolet-shielding resin layer that contains a carbon black having specific properties as a blackish pigment and has a surface roughness within a predetermined range in terms of arithmetic mean roughness Ra is effective in achieving the objects. Further, the prevent inventors also obtained the following findings.

In the ultraviolet-shielding resin layer, in order to reliably achieve removal with a laser light beam, a large amount of carbon black has to be contained. However, when the carbon black content is too high, this leads to a problem in that the hardness of the resin layer decreases, resulting in reduced resistance to scratches. They found that this problem can be solved when the ultraviolet-shielding resin layer is a multilayer structure composed of two or more layers including a layer (A) having a high carbon black content and a layer (B) having a low carbon black content, and the layer (A) is provided on the base-film side of the ultraviolet-shielding resin layer and the layer (B) is provided on the printing-plate side of the ultraviolet-shielding resin layer.

The present invention was accomplished based on such findings.

Specifically, the invention provides:

[1] A member for masking films, comprising a base film that is transparent to ultraviolet rays and an ultraviolet-shielding resin layer having an average thickness of 0.1 to 30 µm provided on one surface of the base film, said ultraviolet-shielding resin layer being capable of being removed by irradiation with a laser light beam, wherein:

(1) the ultraviolet-shielding resin layer has a light transmittance of not more than 1.0% and a reflectance of not more than 10% in the entire wavelength range from 400 to 1100 nm, and also has an ultraviolet transmittance of not more than 0.1% in the entire wavelength range from 300 to 380 nm before irradiation with a laser light beam, (2) the ultraviolet-shielding resin layer comprises a multilayer structure composed of two or more layers comprising a layer (A) and a layer (B) that comprise a carbon black having an average particle diameter of 10 to 50 nm and a specific surface area of 70 to 150 $m^2$/g and a binder resin, the proportion of the carbon black in the layer (A) being 1 to 2 times the binder resin by mass and the proportion of the carbon black in the layer (B) being 0.5 to less than 1 times the binder resin by mass, and (3) the layer (A) is provided on a base film side of the ultraviolet-shielding resin layer and the layer (B) is provided on a printing-plate side of the ultraviolet-shielding resin layer, an arithmetic mean roughness Ra of a surface of the multilayer structure being 0.05 to 3.0 µm;

[2] The member for masking films according to [1] above, wherein the layer (P) comprises a filler in a proportion of 1 to 15 mass %;

[3] The member for masking films according to [1] or [2] above, wherein the ultraviolet-shielding resin layer comprises, as the binder resin, a vinyl chloride/vinyl acetate copolymer and/or an acrylic resin or the resin together with an isocyanate-based crosslinking agent in an amount of not more than 65 mass % relative to the resin;

[4] The member for masking films according to any one of [1] to [3] above, wherein a protective layer having a thickness of 0.05 to 1.5 µm and comprising, as a resin component, a resin having a glass-transition temperature Tg of not less than 40° C. is laminated to a surface of the outermost layer of the ultraviolet-shielding resin layer;

[5] The member for masking films according to [4] above, wherein the resin having a Tg of not less than 40° C. is a polyester-based resin;

[6] The member for masking films according to any one of [1] to [5] above, wherein the base film that is transparent to ultraviolet rays has an internal haze value of not more than 2%;

[7] The member for masking films according to any one of [1] to [6] above, wherein the base film that is transparent to ultraviolet rays has been subjected to a roughening treatment by sandblasting an ultraviolet-shielding-resin-layer-side surface thereof or forming a mat coating layer on said surface;

[8] The member for masking films according to any one of [1] to [7] above, wherein a layer that is to be in contact with a printing plate has a surface hardness of not less than pencil hardness H;

[9] A process for producing a masking film, wherein the process comprises etching the ultraviolet-shielding resin layer of the member for masking films according to any one of [1] to [B] above by irradiation with a laser light beam to form a desired pattern; and

[10] process for producing a photosensitive resin printing plate, wherein the printing plate is produced using a masking film obtained by the process according to [9] above.

Effects of the Invention

According to the present invention, the ultraviolet-shielding resin layer is a multilayer structure composed of two or more layers including a layer (A) having a high carbon black content and a layer (B) having a low carbon black content, and the layer (A) is provided on the base-film side of the ultraviolet-shielding resin layer and the layer (B) is provided on the printing-plate side of the ultraviolet-shielding resin layer. This makes it possible to obtain a member that is excellent in terms of the production stability of the ultraviolet-shielding resin layer while maintaining abrasion resistance and adhesion with the base film, and is suitable for the production of a masking film to be used in the production of a photosensitive resin printing plate or the like. Further, the member for masking films have the following advantages: areas at which the ultraviolet-shielding resin layer is removed accurately and precisely with a low-energy laser beam exhibit uniform light transmittance; the ultraviolet-shielding resin layer is resistant to scratches; further, the member for masking films provides a masking film which, in the production of a large-sized printing plate, allows easy positioning and is less likely to trap air when brought into close contact with the printing plate, so that the entire surface easily comes into close contact with a printing material; etc. The present invention also makes it possible to provide a process for producing a masking film using the same and a process for producing a photosensitive resin printing plate using the masking film.

MODE FOR CARRYING OUT THE INVENTION

First, the member for films for masking of the present invention will be described.
[Member for Masking Films]
The member for masking films of the present invention is characterized by including a base film transparent to ultraviolet rays and, on one surface thereof, an ultraviolet-shielding resin layer that is capable of being removed by irradiation with a laser light beam, has a thickness of 0.1 to 30 μm, and has the specific characteristics mentioned below.
(Base Film)
The base film used for the member for masking films of the present invention is not particularly limited as long as it is transparent to ultraviolet rays. However, a film having a transmittance of not less than 20% for an active ray in the specific wavelength of the light source (e.g., a 60 UV lamp), which cures a photosensitive resin printing material, and also having excellent heat resistance, thermal dimensional stability, and mechanical properties is suitable. Further, in order to faithfully produce a plate of a finer image, with respect to the internal haze value of the base film (haze value of the base film before performing the below-mentioned surface-roughening treatment), a smaller value is more preferable, and a value of not more than 2% is desirable. Examples of such films include films made of polyester-based resins such as polyethylene terephthalate, polybutylene terephthalate, and polyethylene naphthalate, polyamide-based resins, polyimide-based resins, polyamidoimide-based resins, polyetheretherketone-based resins, polyethersulfone-based resins, polyetherimide-based resins, polysulfone-based resins, polyphenylenesulfide-based resins, polyetherimide-based resins, mixed resins thereof, and the like. Further, films obtained by subjecting these films to an easy-adhesion treatment are also usable. The thickness of the base film is selected usually from a range of 25 to 500 μm, and preferably 100 to 300 μm.

Besides, the internal haze value of the base film (the haze value of the base film before performing a roughening treatment) is a value measured according to JIS K 7136 using a haze meter.

In the present invention, if desired, the ultraviolet-shielding-resin-layer-side surface of the base film can be subjected to a roughening treatment. By subjecting the base film to a roughening treatment, the arithmetic mean roughness Ra of the surface of the ultraviolet-shielding resin layer can be adjusted to a desired value. As the method for such a roughening treatment, a method in which a mat coating layer is provided, sandblasting process, and the like can be mentioned. The roughness of the roughened surface is preferably an arithmetic mean roughness Ra of 0.05 to 3.0 μm, and more preferably 0.1 to 1.0 μm, approximately.

Besides, the arithmetic mean roughness of the roughened surface of the base film is a value measured according to JIS B 601-1994 using a surface roughness measuring apparatus.

The mat coating layer can be formed by applying a coating agent, which contains a resin having a glass-transition temperature Tg of not less than 40° C. with about 1 to about 30 mass % of a filler added thereto as a matting agent, to a dry thickness of about 0.05 to about 1.0 μm, followed by drying.

As the resin, an acrylic resin, a vinyl chloride/vinyl acetate copolymer, a polyester-based resin, or the like can be used, and a polyester-based resin is particularly preferable.

As the filler for use as the matting agent, either an inorganic filler or an organic filler can be used. Examples of inorganic fillers include particles of silica, barium sulfate, calcium carbonate, talc, kaolin, titania, zirconia, mica, glass heads, and the like. Examples of organic tillers include polymethyl methacrylate particles, polycarbonate particles, polystyrene particles, polyacrylic styrene particles, polyvinyl chloride particles, benzoguanamine resin particles, and benzoguanamine/melamine/formaldehyde condensate particles.

One kind of such a filler may be used alone, and it is also possible to use two or more kinds in combination. The average particle size of these fillers is usually about 0.001 to about 8 μm, and preferably 0.01 to 5 μm.
(Ultraviolet-Shielding Resin Layer)
In the member for masking films of the present invention, the ultraviolet-shielding resin layer to be provided on one surface of the base film is capable of being removed by irradiation with a laser light beam and has an average thickness selected from a range of 0.1 to 30 μm. When the thickness is less than 0.1 μm, it is difficult to obtain desired shielding properties. Meanwhile, when it is more than 30 μm, the accuracy of parting lines in printing decreases, and, in addition, etching with a laser beam may take a longer period of time, causing the deformation of the masking film due to the heat generated by the laser beam. The average thickness is preferably within a range of 0.5 to 20 μm, and particularly preferably within a range of 0.8 to 10 μm.

In the present invention, it is required that the ultraviolet-shielding resin layer is a multilayer structure composed of two or more layers including a layer (A) that contains the carbon black in a proportion of 1 to 2 times the binder resin by mass of and a layer (H) that contains the carbon black in a proportion of 0.5 to less than 1 time the binder resin by mass, and also that the layer (A) is provided on the base-film side of the ultraviolet-shielding resin layer and the (B) layer is provided on the printing-plate side of the ultraviolet-shielding resin layer, with the arithmetic mean roughness Ra of the surface of the multilayer structure being 0.05 to 3.0 μm, and preferably 0.1 to 10 μm.

Besides, the arithmetic mean roughness Ra is a value measured according to JIS B 601-1994 using a surface roughness measuring apparatus.

The layer (B) having a low carbon black content is located on the side of the multilayer structure closer to the printing plate, and the layer (A) having a high carbon black content is located inside the multilayer structure, preferably on the base film surface or on a mat coating layer provided on the surface of the base film; as a result, uniform light transmittance is obtained in areas of accurate and precise removal with a low-energy laser beam, and, in addition, the ultraviolet-shielding resin layer has excellent abrasion resistance and is resistant to scratches, and also has excellent adhesion with the base film. Further, the outermost value of the multi layer structure, i.e., the arithmetic mean roughness Ra of the layer (B), is within the above range; as a result, a member for masking films can be obtained, which provides a masking film which, in the production of large-sized printing plate, allows easy positioning and is less likely to trap air when brought into close contact with a printing material, so that the entire surface easily comes into close contact with the printing material. The average thickness of the layer (A) is usually about 0.08 to about 24 μm, preferably 0.4 to 16 μm, and still more preferably 0.6 to 8 μm. When the thickness of the layer (A) is less than 0.08 μm, it is difficult to obtain desired shielding properties. Meanwhile, when it is more than 24 μm, etching with a laser beam takes a longer period of time. The average thickness of the layer (B) is usually about 0.02 to about 10 μm, preferably 0.1 to 8 μm, and still more preferably 0.2 to 5 μm. When the thickness of the layer (B) is less than 0.02 μm, it is difficult to obtain abrasion resistance. Meanwhile, when it is more than 10 μm, this results in a thick layer having a low carbon black content, whereby the removal of the ultraviolet-shielding layer may be insufficient.

The member for masking films of the present invention having such a configuration is suitable for the production of masking films to be used in the production of a photosensitive resin printing plate or the like.

In the case where the ultraviolet-shielding resin layer is a multilayer structure formed of two layers, the configuration is such that the layer (A) is provided on the base film surface or on a mat coating layer provided on the base film surface, and the layer (b) is provided thereon. Further, in the case of a multilayer structure formed of three or more layers, it is preferable that between the layer (A) and the layer (B) in the above two-layer laminate, at least one layer having a different carbon black content is provided. In terms of the effects of the present invention, it is more preferable that such a layer interposed between the layer (A) and the layer (B) has an inclined configuration such that the carbon black content thereof gradually decreases in the direction from the layer (A) to the layer (B).

In the ultraviolet-shielding resin layer, in or order to provide the surface of the multilayer structure with an arithmetic mean roughness Ra within a range of 0.05 to 3.0 μm, it is preferable that the layer (A) and/or layer (B) of the multilayer structure contains about 1 to about 15 mass % of a filler as a matting agent, and it is particularly preferable that the filler is contained in the layer (B) that is located on the outer side. As such a filler, an inorganic filler and/or organic filler can be used. The kinds thereof may be the same as those described as matting agents for the mat coating layer optionally provided on the base film surface.

Further, it is required that the ultraviolet-shielding resin layer has an ultraviolet transmittance of not more than 0.1% in the entire wavelength range from 300 to 380 nm before irradiation with a laser light beam. In the case where the transmittance is more than 0.1%, when a photosensitive resin layer is irradiated with, an active ray through a masking film obtained from such a member for masking films, followed by development to form a pattern corresponding to the pattern of the masking film, the resolution may be insufficient.

Further, in order to achieve the capability to be removed by irradiation with a laser light beam, it is required that the light transmittance is not more than 1.0% and the reflectance is not more than 10% in the entire wavelength range from 400 to 1100 nm, which is the wavelength range of a commonly used laser beam.

Besides, the ultraviolet transmittance of the ultraviolet-shielding resin layer in the entire wavelength range from 300 to 380 nm before irradiation with a laser light beam and the light transmittance and reflectance of the ultraviolet-shielding resin layer in the entire wavelength range from 400 to 1100 nm are values measured using an ultraviolet-visible spectrophotometer.

In order to achieve the above ultraviolet-shielding properties and absorption in the laser beam wavelength range, the ultraviolet-shielding resin layer contains a blackish pigment together with the binder resin. As such a blackish pigment, a carbon black having an average particle size of 10 to 50 nm, particularly preferably 20 to 50 μm, and a specific surface area of 70 to 150 m$^2$/g is used. Besides, the above average particle size can be measured by electron microscopic observation, and the specific surface area can be measured by a nitrogen adsorption method according to JIS Z 8830. By using the carbon black with such an average particle size and such a specific surface area, the ultraviolet-shielding resin layer has excellent adhesion with the base film. The carbon black may be channel black, furnace black, acetylene black, thermal black, or the like depending on the production method, and any of them can be used.

In the present invention, in addition to the carbon black, optionally, black chromium oxide, titanium black, black iron oxide, black organic pigments such as aniline black, and besides, mixed-color organic pigments having a black-like color obtained by mixing at least two kinds of organic pigments selected from red, blue, green, purple, yellow, cyan, and magenta, and the like may be used together.

Meanwhile, as the binder resin used for the ultraviolet shielding resin layer, various kinds of resins are usable without particular limitation as long as the dispersibility of the blackish pigment is excellent so that when the ultraviolet-shielding resin layer is formed, sufficient light-blocking properties can be obtained with small thickness and the surface is tack-free. Examples of such resins include vinyl chloride/vinyl acetate copolymers, ethylene-acrylic copolymers, styrene-based resins, polyolefin-based resins, acrylic resins, vinyl-acetate-based resins, polyurethane-based resins, vinyl-chloride-based resins, and vinylidene-chloride-based resins. One kind of such a resin may be used alone, and it is also possible to use two or more kinds in combination. Among these, a vinyl chloride/vinyl acetate copolymer and/or an acrylic resin or such a resin together with an isocyanate-based crosslinking agent in an amount of not more than 65 mass relative to the resin is particularly preferable.

The isocyanate-based crosslinking agent functions to improve the hardness of the ultraviolet-shielding resin layer through a reaction with an acrylic resin to cause crosslinking or a reaction between crosslinking agents.

When the content of the isocyanate-based crosslinking agent is more than 65 mass % relative to the resin, this leads to an increased amount of unreacted isocyanate. As a result, tack remains on the coated surface immediately after coating, and blocking, poor appearance, and the like are likely to occur after winding up. Such a content is thus undesirable. The content of the isocyanate-based crosslinking agent is more preferably not more than 60 mass %, and still more preferably 10 to 55 mass %.

Examples of isocyanate-based crosslinking agents include aromatic polyisocyanates such as tolylene diisocyanate, diphenylmethane diisocyanate, and xylylene diisocyanate, aliphatic polyisocyanates such as hexamethylene diisocyanate, alicyclic polyisocyanates such as isophorone diisocyanate and hydrogenated diphenylmethane diisocyanate, biurets and isocyanurates thereof, and further adducts thereof which are reaction products with low-molecular, active-hydrogen-containing compounds, such as ethylene glycol, propylene glycol, neopentyl glycol, trimethylolpropane, and castor oil.

In the present invention, one kind of such a crosslinking agent may be used alone, and it is also possible to use two or more kinds in combination.

When the ultraviolet-shielding resin layer of such composition is irradiated with a high-power laser light beam, the blackish pigment absorbs the wavelength energy of the laser light beam, and heat is generated locally in the irradiated areas. The blackish pigment and the resin in the heating resin layer undergo pyrolysis or sublimation, whereby the irradiated areas are removed and become transparent to ultraviolet rays. The region that has undergone the removal by the irradiation of the member for masking films with a laser light beam preferably has an ultraviolet transmittance of not less than 20% like the base film transparent to ultraviolet rays.

In the ultraviolet-shielding resin layer, each of the layers forming the multilayer structure composed of two or more layers can be formed, for example, by preparing a coating liquid containing the blackish pigment and the binder resin in an appropriate solvent, and then applying the same to one surface of the base film transparent to ultraviolet rays using a known application method such as bar coating, knife coating, roll coating, blade coating, die coating, or gravure coating, followed by heat-drying or a curing treatment.

With respect to the ultraviolet-shielding resin layer formed of the thus-obtained multilayer structure composed of two or more layers, it is required that, as mentioned above, the surface roughness thereof is an arithmetic mean roughness Ra of 0.05 to 3.0 μm, and preferably 0.1 to 1.0 μm. When the Ra is within the above range, in the production of a large-sized printing plate, positioning on the plate is easy, and, when making the ultraviolet-shielding resin layer contact closely with the plate, it is easy to drive out trapped air, resulting in improved, production efficiency.

Further, it is preferable that the surface hardness of the ultraviolet-shielding resin layer is not less than H in terms of pencil hardness. When the hardness is less than H in terms of pencil hardness, in a masking film obtained from the member for masking films of the present invention, the ultraviolet-shielding resin layer is more susceptible to breakage, whereby printing accuracy may decrease.

Besides, the pencil hardness of the ultraviolet-shielding resin layer surface is the value measured according to JIS K 5600-5-4.

In the present invention, if desired, in order to protect the ultraviolet-shielding resin layer, it is preferable to laminate, to the surface thereof the side that comes into contact with the layer (B), a protective layer that contains, as resin component, a resin with a glass-transition temperature Tg of not less than 40° C. and has a thickness of 0.05 to 0.5 μm, and preferably about 0.1 to about 0.5 μm. Also in this case, it is required that the arithmetic mean roughness Re of the surface of the protective, layer is 0.05 to 3.0 μm, and preferably 0.1 to 1.0 μm. As the resin, an acrylic resin, a vinyl chloride/vinyl acetate copolymer, a polyester-based resin, or the like can be used, and a polyester-based resin is particularly preferable. Further, it is preferable that the protective layer also contains about 1 to about 30 mass % of a filler as a matting agent. As such a filler, an inorganic filler and/or organic filler can be used. The kinds thereof may be the same as those described as matting agents for the mat coating layer optionally provided on the base film surface.

Figure 1:
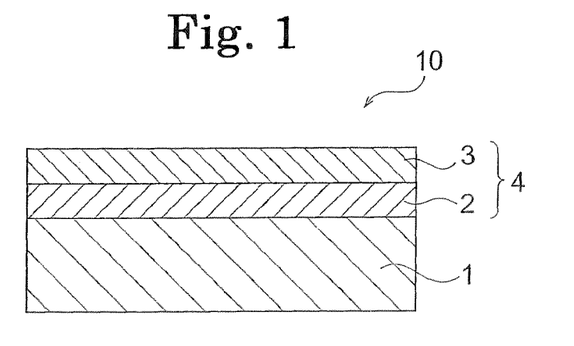
FIG. 1 is a schematic cross-sectional view showing an example of the configuration of the member for masking films of the present invention.
Figure 2:
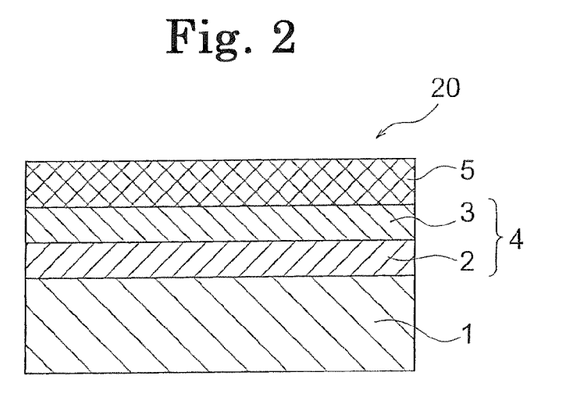
FIG. 2 is a schematic cross-sectional view showing another example of the configuration of the member for masking films of the present invention.
Figure 3:
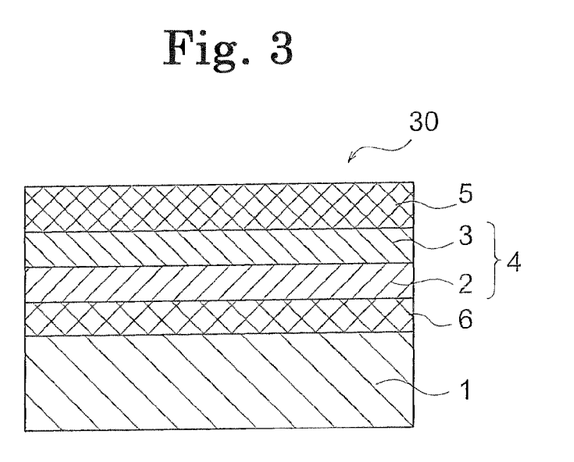
FIG. 3 is a schematic cross-sectional view showing still another example of the configuration of the member for masking films of the present invention. In the figures, the reference numeral 1 indicates a base film, 2 indicates a carbon-black-containing resin layer (A), 3 indicates a carbon-black-containing resin layer (B), 4 indicates an ultraviolet-shielding resin layer, 5 indicates a protective layer, 6 indicates a mat coating layer or a sandblasted layer, and 10, 20, and 30 indicate members for masking films.

Next, the member for masking films of the present invention will be described with reference to the attached drawings. FIG. 1, FIG. 2, and FIG. 3 are schematic cross-sectional views showing examples of the member for masking films of the present invention with different configurations. FIG. 1 shows a member 10 for masking films, which is configured to have art ultraviolet-shielding resin layer 4 including the layer (A) 2 and the layer (B) 3 successively laminated on the surface of a base film 1.

FIG. 2 shows a member 20 for masking films, which is configured to have an ultraviolet-shielding resin layer 4 including the layer (A) 2 and the layer (B) 3 successively laminated on the surface of a base film 1, and also have a protective layer 5 laminated on the top layer of the ultraviolet-shielding resin layer 4.

FIG. 3 shows a member 30 for masking films, which is configured to have an ultraviolet-shielding resin layer 4 including the layer (A) 2 and the layer (B) 3 successively laminated on a mat coating layer or sandblasted layer 6 provided on the surface of a base film 1, and also have a protective layer 5 laminated on the top layer of the ultraviolet-shielding resin layer 4.

Next, the process for producing a masking film of the present invention will be described.

[Process for Producing Masking Film]

The process for producing a masking film of the present invention is characterized in that the ultraviolet-shielding resin layer of the member for masking films of the present invention mentioned above is etched by irradiation with a laser light beam to form a desired pattern.

At this time, as a laser oscillator, an infrared laser such as a carbon dioxide laser (oscillation wavelength: 1060 nm), a neodymium YAP laser (the same: 1060 nm), or a neodymium glass laser (the same: 1060 nm) can be used, for example. Among these, a neodymium YAP laser is preferable. These laser oscillators may be continuous oscillation or pulse oscillation. The output power is suitably selected depending on the thickness of the ultraviolet-shielding resin layer, the kind of resin, etc., and is usually, in the case of continuous oscillation, about 0.5 to about 10 W.

A laser oscillator, an apparatus that allows a desired irradiation position to be irradiated by digital control is preferable. Such an apparatus allows a printing pattern to be stored in a computer as digital data so that a masking film can be produced by computer control, and thus is preferable.

Uses of the masking film in the present invention are not particularly limited, and it may be used for various applications where a transmission film having a desired pattern is used as a mask. For example, it is suitable as a masking film for use in the production of a photosensitive resin printing plate. Examples of photosensitive resin printing plates to which the invention is applicable include flexographic printing plates, letterpress printing plates, offset printing plates, gravure printing plates, and screen printing plates. Of these, the invention is particularly suitable as a negative film for use in the production of a flexographic printing plate.

Further, in the production of a printed wiring board, a solder resist is used for the formation of a film over the entire surface of a circuit conductor except for the solder portion. In the soldering of an electronic component to a printed wiring board, the solder resist serves as a protective film for preventing the solder from adhering to undesired portions and also for preventing the circuit conductor from being directly exposed to air and corroded by oxygen or moisture.

As such a solder resist, one containing a dilute-alkali-developable photosensitive resin is usually used. The solder resist is used in the following manner. First, the solder resist is coated on a printed circuit board and then subjected to a pre-drying process to make the coated surface tack-free. After that, exposure is performed through a masking film, followed by development with a dilute alkali solution and subsequent heat curing.

Also as a masking film for such solder resists, the masking film in the present invention is usable.

Next, the process for producing a photosensitive resin printing plate of the present invention will be described.

[Process for Producing Photosensitive Resin Printing Plate]

According to the process for producing a photosensitive resin printing plate of the present invention, on, a plate is produced using a masking film obtained by the process for producing a masking film mentioned above, thereby producing a photosensitive resin printing plate. As the photosensitive resin printing plate, the above various printing plates can be mentioned. Among these, a flexographic printing plate can be mentioned as a particularly preferred example.

In the production of a flexographic printing plate, for example, a printing material formed of a sheet-shaped photosensitive resin that is soluble in a developing (washing) liquid when uncured is used. Then, the photosensitive resin reacts or cures through crosslinking or polymerization in areas irradiated with an active ray, such as an ultraviolet ray, and thus becomes insoluble in a developing liquid. Such a flexographic printing material may be a multilayer structure having as a substrate a rubber-like elastomer, such as polyisoprene or NBR.

Generally, a flexographic printing plate can be produced by the following method.

First, the back side of the printing material is subjected to UV pre-exposure. Then, as a negative film, a masking film with a desired pattern obtained by the present invention is brought into close contact with the front side of the printing material in such a manner that the ultraviolet-shielding-resin-layer side thereof faces the front side, followed by main exposure. Next, the masking film is removed, followed by development (washing) to remove the unexposed resin. A drying treatment is then performed, and post-exposure is further performed to give a desired flexographic printing plate. For each exposure, an ultraviolet ray in a wavelength region of 300 to 400 nm is usually used.

The thus-produced flexographic printing plate usually has a Shore A hardness of about 40 to about 50.

EXAMPLES

Next, the present invention will be explained in further detail with reference to the examples, but the present invention is not limited to these examples.

Besides, various characteristics in each example were evaluated according to the methods shown below.

(1) Optical Properties of Masking Film

Ultraviolet transmittance in an wavelength range of 300 to 380 nm before laser beam irradiation and light transmittance and reflectance in an wavelength range of 400 to 1100 nm were measured using an ultraviolet-visible spectrophotometer [model name "UV-3600", manufactured by SHIMADZU CORPORATION]

(2) Arithmetic Mean Roughness Ra of Masking Film Surface

Measurement was performed according to JIS B 601-1994 using a surface roughness measuring apparatus "SV30000S4" manufactured by Mitutoyo Corporation.

(3) Pencil Hardness of Masking Film Surface

Pencil hardness was measured according to JIS K 5600-5-4 using an apparatus for measurement [model name "Pencil Scratch Coating Hardness Tester NP", manufactured by Toyo Seiki Seisaku-Sho, Ltd.].

(4) Haze Value of Base Film

Measurement was performed according to JIS K 7136 using a haze meter "NDH2000" manufactured by NIPPON DENSHOKU INDUSTRIES CO., LTD.

(5) Adhesion of Ultraviolet-Shielding Resin Layer

An ultraviolet-shielding resin layer was subjected to a cellophane adhesive tape adhesion test according to JIS K 5600-5-6, and adhesion was evaluated according to the following criteria. Besides, the cellophane adhesive tape used is "CELLOTAPE®", No. LP-24, manufactured by Nichiban Co., Ltd.

<Criteria>

0: No peeling

1: Slight peeling at cut intersections

2: Peeling along cut edges and/or at intersections

3: Partial or complete peeling along cut edges, and/or partial or complete peeling of various portions of sections 4: Partial or complete peeling along cut edges, and/or partial or complete peeling of several sections 5: Great peeling that cannot be classified into 4

(6) Slidability between Masking Film and Photosensitive Resin Printing Plate Material The smoothness of a masking film surface was determined by the following method, and the slidability with photosensitive resin printing material was evaluated.

<Smoothness of Masking Film Surface>

Smoothness was measured according to JIS P 8119 using a smoothness tester [trade name "Digi-Bekk Smoothness Tester, Model DB-2", manufactured by Toyo Seiki Seisaku-Sho, Ltd.]. Smoothness was thus determined.

(7) Check of Annihilation Energy and Production of Masking Film upon Laser Beam Irradiation of Ultraviolet-Shielding Resin Layer Patterns of solid fills, various-sized letters, lines, and halftone, dots were digitally processed as patterns for testing the accuracy of plate production. Using a laser irradiation apparatus [CDI "Spark 2120", manufactured by Esko Artwork], an A4 size film having an ultraviolet-shielding resin layer was patterned to give a masking film. The conditions of patterning were observed visually and also under confocal microscope "HD100D" manufactured by Lasertec Corporation to check the laser beam irradiation energy for processing into a desired pattern.

(8) Production of Printing Plate

Using printing plate producing machine [trade name "DX-A3" manufactured by Takano Machinery Works, Co. LTD.], the following steps of printing plate production were collectively handled to produce printing plate.

First, the back side of a photosensitive resin printing material [trade name "Cyrel AQS", manufactured by DuPont, thickness: 1.7 mm] was irradiated with an ultraviolet ray having a wavelength of 360 nm for 55 seconds as pre-exposure. Then, the masking film obtained in (7) above was brought into close contact with the front side of the printing material in such a manner that the light-shielding-resin-layer side of the masking film faces the front side. An ultraviolet ray was then applied thereto through the masking film for 14 minutes as main exposure.

The masking film was separated and removed from the plate material, and the plate material was washed with water having 3 mass % of a surfactant at 55° C. for 11 minutes and 30 seconds to remove unexposed portions. Subsequently, a drying treatment was performed at 70° C. for 20 minutes, and further UV irradiation was performed for 35 minutes as post-exposure, thereby giving a printing plate having a predetermined test printing pattern. A printing test was performed using "MA-2200" manufactured by LINTEC Corporation, and printability was observed visually and also under a 7× magnifying lens as the evaluation of printability, when an alphabetical letter with a size of 2 pt was legible, such a case was evaluated as Good, while when illegible, such a case was evaluated as Poor. [Ink: trade name "UV Flexo AF, Indigo", manufactured by T&K TOKA Co., Ltd.; Printed matter: "Gross PW8K", manufactured by LINTEC Corporation]

Example 1

To one surface of a polyethylene terephthalate (PET) film having a thickness of 125 μm and a haze value of 0.95% [trade name "COSMOSHINE A4100", manufactured by Toyobo Co., Ltd.], a carbon-black-containing resin liquid (A) [resin component: vinyl chloride/vinyl acetate copolymer having a Tg of not less than 40° C., carbon black average particle size: 24 nm, specific surface area: 115 g/m$^2$, carbon black/resin content mass ratio: 1.61/1] was applied to an average dry thickness of 2.0 μm, followed by drying to form a layer (A). Then, onto the layer (A), a carbon-black-containing resin liquid (B) [resin component: vinyl chloride/vinyl acetate copolymer having a Tg of not less than 40° C., carbon black average particle size: 24 nm, specific surface area: 115 g/m$^2$, carbon black/resin content mass ratio: 0.85/1, silica filler: 8 mass %] was applied to an average dry thickness of 0.5 μm, followed by drying to form a layer (B). An ultraviolet-shielding resin layer was thus formed, thereby producing a member for masking films. Table 1 shows the properties of this member.

Example 2

To one surface of a PET film having a thickness of 125 μm and a haze value of 0.95% (mentioned above), carbon-black-containing resin liquid (A) [resin component: acrylic resin having a Tg of not less than 40° C. with 32 mass % of a hexamethylene-diisocyanate (HDI)-based isocyanate crosslinking agent added thereto, carbon black average particle size: 24 nm, specific surface area: 115 g/m$^2$, carbon black/resin content mass ratio: 1.36/1, silica filler added in an amount of 10 mass %] was applied to an average dry thickness of 2.0 μm, followed by drying to form a layer (A). Then, onto the layer (A), a carbon-black-containing resin liquid (B) [resin component: acrylic resin having a Tg of not less than 40° C. with 59 mass % of an HDI-based isocyanate crosslinking agent added thereto, carbon black average particle size: 24 nm, specific surface area: 115 q/m$^2$, carbon black/resin content mass ratio: 0.83/1, silica filler: 8 mass %] was applied to an average dry thickness of 0.5 μM, followed by drying to form a layer (B). An ultraviolet-shielding resin layer was thus formed, thereby producing a member for masking films. Table 1 shows the properties of this member.

Example 3

To one surface of a PET film having a thickness of 125 μm and a haze value of 0.95% (mentioned above), carbon-black-containing resin liquid (A) [resin component: acrylic resin having a Tg of not less than 40° C. with 32 mass % of an HDI-based isocyanate crosslinking agent added thereto, carbon black average particle size: 24 nm, specific surface area: 115 g/m$^2$, carbon black/resin content mass ratio: 1.36/1, silica filler added in an amount of 10 mass %] was applied to an average dry thickness of 2.0 μm, followed by drying to form a layer (A). Then, onto the layer (A), carbon-black-containing resin liquid (B) [resin component: acrylic resin having a Tg of not less than 40° C. with 59 mass % of an HDI-based isocyanate crosslinking agent added thereto, carbon black average particle size: 24 nm, specific surface area: 115 g/m$^2$, carbon black/resin content mass ratio: 0.83/1, silica filler: 8 mass %] was applied to an average dry thickness of 0.5 μm, followed by drying to form a layer (B). Further, onto the layer (B), a protective layer [resin component: polyester resin having a Tg of not less than 40° C. with 4 mass % of a silica filler added thereto] was applied to an average dry thickness of 0.2 μm, followed by drying. An ultraviolet-shielding resin layer having a protective layer was thus formed, thereby producing a member for masking films. Table 1 shows the properties of this member.

Example 4

A member for masking films was produced in the same manner as in Example 3, except that: a polyester resin having a Tg of not less than 40° C. with 25 mass % of a silica filler added thereto was used as the protective layer to be formed on the layer (B) in Example 3. Table 1 shows the properties of this member.

Example 5

To one surface of a PET film having a thickness of 125 μm and a haze value of 0.95% (mentioned above), a liquid for a mat coating layer [resin component: polyester resin having a Tg of not less than 40° C. with 4 mass % of a silica filler added thereto] was applied to an average dry thickness of 0.3 μm, followed by drying to form a mat coating layer. Onto this mat coating layer, a carbon-black-containing resin liquid (A) [resin component: acrylic resin having a Tg of not less than 40° C. with 32 mass % of an HDI-based isocyanate crosslinking agent added thereto, carbon black average particle size: 24 nm, specific surface area: 115 g/m$^2$, carbon black/resin content mass ratio: 1.36/1, silica filler added in an amount of 10 mass %] was applied to an average dry thickness of 2.0 μm, followed by drying to form a layer (A). Then, onto the layer (A), a carbon-black-containing resin liquid (B) [resin component: acrylic resin having a Tg of not less than 40° C. with 59 mass % of an HDI-based isocyanate crosslinking agent added thereto, carbon black average particle size: 24 nm, specific surface area: 115 g/m$^2$, carbon black/resin content mass ratio: 0.83/1, silica filler: 8 mass %] was applied to an average dry thickness of 0.5 μm, followed by drying to form a layer (B). Further, onto the layer (B), a protective, layer [resin component: polyester resin having a Tg of not less than 40° C. with 4 mass % of a silica filler added thereto] was applied to an average dry thickness of 0.2 μm, followed by drying. An ultraviolet-shielding resin layer having a protective layer was thus formed, thereby producing a member for masking films. Table 1 shows the properties of this member.

Comparative Example 1

To one surface of a PET film having a thickness of 125 μm and a haze value of 0.95% (mentioned above), carbon-black-containing resin liquid [resin component: vinyl chloride/vinyl acetate copolymer having a Tg of not less than 40° C., carbon black average particle size: 24 nm, specific surface area: 115 g/m², carbon black/resin content mass ratio: 0.83/1] was applied to an average dry thickness of 5 μm, followed by drying treatment to form an ultraviolet-shielding resin layer. A member for masking films was thus produced. Table 1 shows the properties of this member.

Comparative Example 2

To one surface of a PET film having a thickness of 125 μm and haze value of 0.95% (mentioned above), carbon-black-containing resin liquid [resin component: acrylic resin having a Tg of not less than 40° C., carbon black average particle size: 24 nm, specific surface area: 115 carbon black/resin content mass ratio: 2/1, silica filler: 13 mass %] was applied to an average dry thickness of 3 μm, followed by a drying treatment to form an ultraviolet-shielding resin layer. A member for masking films was thus produced. Table 1 shows the properties of this member.

TABLE 1

|  | Example 1 | Example 2 | Example 3 | Example 4 | Example 5 |
|---|---|---|---|---|---|
| 300-380 nm Transmittance (%) | 0.1> | 0.1> | 0.1> | 0.1> | 0.1> |
| 400-1100 nm Transmittance (%) | 1.0> | 1.0> | 1.0> | 1.0> | 1.0> |
| 400-1100 nm Reflectance (%) | 10> | 10> | 10> | 10> | 10> |
| Adhesion | 0 | 0 | 0 | 0 | 0 |
| Roughness Ra (μm) | 0.12 | 0.16 | 0.18 | 0.32 | 0.19 |
| Slidability between Masking Film and Photosensitive Resin Printing Plate Material [Smoothness of Masking Film Surface (seconds)] | 3600 | 3200 | 2800 | 700 | 2500 |
| Pencil Hardness | H | H | 2H | 2H | 2H |
| Annihilation Energy from a Laser Beam (J) | 3.2 | 3.2 | 3.2 | 3.2 | 3.2 |
| Printability | Good | Good | Good | Good | Good |

|  | Comparative Example 1 | Comparative Example 2 |
|---|---|---|
| 300-380 nm Transmittance (%) | 0.1> | 0.1> |
| 400-1100 nm Transmittance (%) | 0.5> | 0.5> |
| 400-1100 nm Reflectance (%) | 10> | 10> |
| Adhesion | 0 | 5 |
| Roughness Ra (μm) | 0.02 | 0.16 |
| Slidability between Masking Film and Photosensitive Resin Printing Plate Material [Smoothness of Masking Film Surface (seconds)] | 20000< | 1200 |
| Pencil Hardness | 5H | HB |
| Annihilation Energy from a Laser Beam (J) | 5.3< | 3.2 |
| Printability | Poor | Good |

As shown in Table 1, the members for masking films of Examples 1 to 5 of the present invention are all excellent in terms of all of adhesion, slidability with a photosensitive resin printing material, and printability. Further, their pencil hardness is H or 2H, and annihilation energy from a laser beam is 3.2 J. In contrast, the member for masking films of Comparative Example 1 has a smoothness value of more than 20000 seconds and thus has poor slidability with a photosensitive resin printing material. Further, its printability is also poor, and annihilation energy from a laser beam is more than 5.3 J. In Comparative Example 2, adhesion is poor, pencil hardness is HB, and abrasion resistance is poor.

INDUSTRIAL APPLICABILITY

In the member for masking films of the present invention, the accurate and precise removal of the ultraviolet-shielding resin layer using a low-energy laser beam gives areas with uniform light transmittance, and the ultraviolet-shielding resin layer is resistant to scratches. Further, the member for masking films makes it possible to provide a masking film which, in the production of a large-sized printing plate, allows easy positioning and is less likely to trap air when brought into close contact with the plate, so that the entire surface easily comes into close contact with a printing material.

The invention claimed is:

1. A member for masking films, comprising a base film that is transparent to ultraviolet rays,
    an ultraviolet-shielding resin layer having an average thickness of 0.1 to 30 μm provided on one surface of the base film, and
    a protective layer having a thickness of 0.05 to 1.5 μm and comprising, as a resin component, a polyester-based resin having a glass-transition temperature Tg of not less than 40° C. laminated to a surface of the outermost layer of the ultraviolet-shielding resin layer,
    said ultraviolet-shielding resin layer being capable of being removed by irradiation with a laser light beam, wherein:
    (1) the ultraviolet-shielding resin layer has a light transmittance of not more than 1.0% and a reflectance of not more than 10% in the entire wavelength range from 400 to 1100 nm, and also has an ultraviolet transmittance of not more than 0.1% in the entire wavelength range from 300 to 380 nm before irradiation with a laser light beam,
    (2) the ultraviolet-shielding resin layer comprises a multilayer structure composed of two or more layers comprising a layer (A) and a layer (B) that comprise a carbon black having an average particle diameter of 10 to 50 nm and a specific surface area of 70 to 150 m$^2$/g and a binder resin, a proportion of the carbon black in the layer (A) being 1 to 2 times the binder resin by mass and the proportion of the carbon black in the layer (B) being 0.5 to less than 1 times the binder resin by mass, and
    (3) the layer (A) is provided on a base film side of the ultraviolet-shielding resin layer and the layer (B) is provided on a printing-plate side of the ultraviolet-shielding resin layer, an arithmetic mean roughness Ra of a surface of the multilayer structure being 0.05 to 3.0 μm.

2. The member for masking films according to claim 1, wherein the layer (B) comprises a filler in a proportion of 1 to 15 mass %.

3. The member for masking films according to claim 1, wherein the ultraviolet-shielding resin layer comprises, as the binder resin: (i) a vinyl chloride/vinyl acetate copolymer, (ii) an acrylic resin or (iii) a combination of a resin selected from the group consisting of a vinyl chloride/vinyl acetate copolymer and an acrylic resin together with an isocyanate-based crosslinking agent in an amount of not more than 65 mass % relative to the resin.

4. The member for masking films according to claim 1, wherein the base film that is transparent to ultraviolet rays has an internal haze value of not more than 2%.

5. The member for masking films according to claim 1, wherein the base film that is transparent to ultraviolet rays has been subjected to a roughening treatment by sandblasting an ultraviolet-shielding -resin-layer-side surface thereof or forming a mat coating layer on said surface.

6. The member for masking films according to claim 1, wherein a layer that is to be in contact with a printing plate has a surface hardness of not less than pencil hardness H.

7. A process for producing a masking film, wherein the process comprises etching the ultraviolet-shielding resin layer of the member for masking films according to claim 1 by irradiation with a laser light beam to form a desired pattern.

8. A process for producing a photosensitive resin printing plate, wherein the printing plate is produced using a masking film obtained by the process according to claim 7.

* * * * *